(12) United States Patent
Chuang

(10) Patent No.: US 6,831,349 B2
(45) Date of Patent: Dec. 14, 2004

(54) METHOD OF FORMING A NOVEL TOP-METAL FUSE STRUCTURE

(75) Inventor: Harry Chuang, Austin, TX (US)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 44 days.

(21) Appl. No.: 10/679,737

(22) Filed: Oct. 6, 2003

(65) Prior Publication Data

US 2004/0067623 A1 Apr. 8, 2004

Related U.S. Application Data

(62) Division of application No. 10/075,806, filed on Feb. 13, 2002, now Pat. No. 6,638,796.

(51) Int. Cl.[7] .............................................. H01L 29/00
(52) U.S. Cl. ......................... 257/529; 257/50; 257/209
(58) Field of Search ......................... 257/50, 208, 209, 257/390, 529, 530; 438/131, 132, 600, 601

(56) References Cited

U.S. PATENT DOCUMENTS

| 4,740,485 | A | | 4/1988 | Sharpe-Geisler | 437/246 |
| 4,796,075 | A | | 1/1989 | Whitten | 357/51 |
| 5,895,262 | A | * | 4/1999 | Becker et al. | 438/132 |
| 5,914,524 | A | | 6/1999 | Komenaka | 257/529 |
| 6,004,834 | A | * | 12/1999 | Tsukude et al. | 438/132 |
| 6,100,118 | A | | 8/2000 | Shih et al. | 438/132 |
| 6,162,686 | A | | 12/2000 | Huang et al. | 438/281 |
| 6,277,674 | B1 | | 8/2001 | Wang et al. | 438/132 |

* cited by examiner

Primary Examiner—Kevin M. Picardat

(57) ABSTRACT

A method of forming a top-metal fuse structure comprising the following steps. A structure having an intermetal dielectric layer is formed thereover the structure including a fuse region and an RDL/bump/bonding pad region. A composite metal layer is formed over the intermetal dielectric layer. The composite metal layer including a second metal layer sandwiched between upper and lower first metal layers. The upper first metal layer is patterned to form an upper metal layer portion within the RDL/bump/bonding pad region. The second metal layer and the lower first metal layer are patterned: (1) within the RDL/bump/bonding pad region to form an RDL/bump/bonding pad; the RDL/bump/bonding pad having a patterned second metal layer portion/lower first metal portion with a width greater than that of the upper metal layer portion and forming a step profile; and (2) within the fuse region to form the top-metal fuse structure. The RDL/bump/bonding pad structure includes a step profile.

35 Claims, 2 Drawing Sheets

METHOD OF FORMING A NOVEL TOP-METAL FUSE STRUCTURE

This is a division of patent application Ser. No. 10/075,806, filing date Feb. 13, 2002, now U.S. Pat. No. 6,638,796, Method Of Forming A Novel Top-Metal Fuse Structure, assigned to the same assignee as the present invention.

FIELD OF THE INVENTION

The present invention relates generally to semiconductor fabrication and more specifically to semiconductor device fuse fabrication.

BACKGROUND OF THE INVENTION

Conventional laser fuses now used in the integrated circuit (IC) industry are typically at the metal level (N−1 or N−2) where precise intermetal dielectric (IMD) etch depth control is very difficult, but needed for successful laser repair. This is even more difficult for copper (Cu) interconnects because of damascene processing (more metal and IMD thickness variation due to chemical mechanical polishing (CMP)).

U.S. Pat. No. 6,162,686 to Huang et al. describes a method of forming a grooved fuse (plug fuse) in the same step that via plugs are formed in the guard ring area and in the product device areas.

U.S. Pat. No. 6,100,118 to Shih et al. describes a fuse guard ring method and structure.

U.S. Pat. No. 6,277,674 B1 to Wang et al. describes a fuse and a process for fabricating the fuse.

U.S. Pat. No. 5,914,524 to Komenaka describes a semiconductor device.

U.S. Pat. No. 4,740,485 to Sharpe-Geisler describes a method for forming a titanium tungsten fuse.

U.S. Pat. No. 4,796,075 to Whitten describes a fusible link structure for integrated circuits.

SUMMARY OF THE INVENTION

Accordingly, it is an object of one or more embodiments of the present invention to provide an improved method of forming a top-metal fuse.

Other objects will appear hereinafter.

It has now been discovered that the above and other objects of the present invention may be accomplished in the following manner. Specifically, a structure having an intermetal dielectric layer is formed thereover. the structure including a fuse region and an RDL/bump/bonding pad region. A composite metal layer is formed over the intermetal dielectric layer. The composite metal layer including a second metal layer sandwiched between upper and lower first metal layers. The upper first metal layer is patterned to form an upper metal layer portion within the RDL/bump/bonding pad region. The second metal layer and the lower first metal layer are patterned: (1) within the RDL/bump/bonding pad region to form an RDL/bump/bonding pad; the RDL/bump/bonding pad having a patterned second metal layer portion/lower first metal portion with a width greater than that of the upper metal layer portion and forming a step profile; and (2) within the fuse region to form the top-metal fuse structure. The RDL/bump/bonding pad structure includes a step profile.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Process Known to the Inventor

The following process is known to the inventor and is not to be deemed as prior art to the instant invention.

The copper fuse is migrating from the N−1/N−2 metal layer to the top metal layer. However, the top metal thickness is generally about 9000 Å±3000 Å and has a very narrow process window for laser repair making thicker layers more difficult.

Further, the use of a very thick top aluminum metal of from about 1.5 to 3.0 μm added on top of the copper interconnects for re-distribution layer (RDL) and bump/bond pads makes the copper top metal fuse process yet again more difficult, if not impossible.

Initial Structure

Figure 1:
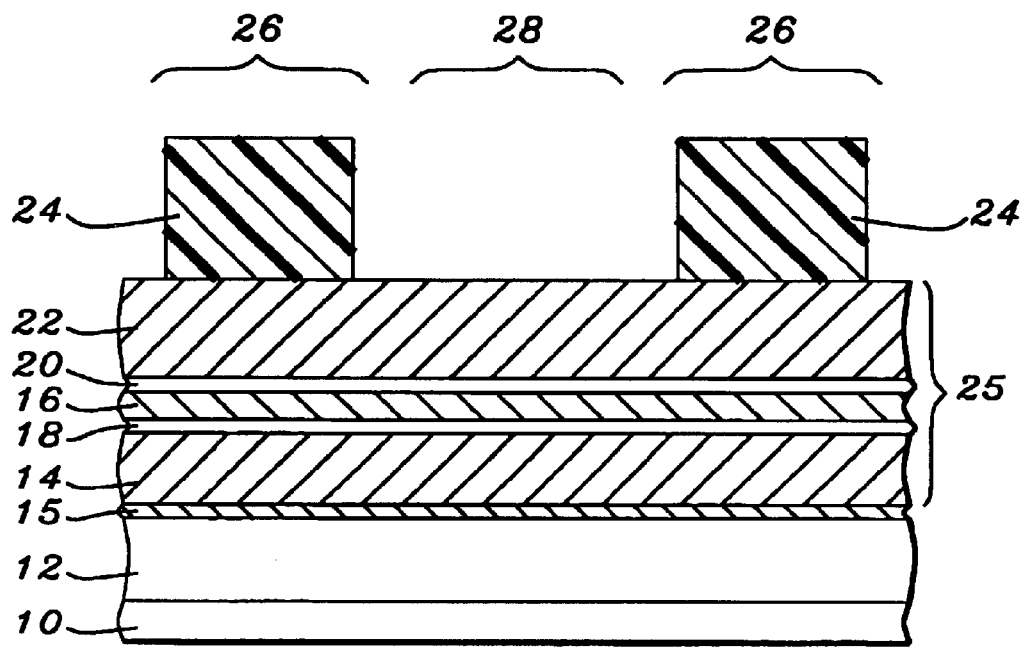
FIGS. 1 to 4 schematically illustrates a preferred embodiment of the present invention.

As shown in FIG. 1, structure 10 has an intermetal dielectric (IMD) layer 12 formed thereover to a thickness of preferably from about 3000 to 15,000 Å. IMD layer 12 is preferably comprised of USG, PSG, BPSG, FSG or SiN and is more preferably USG.

Structure 10 is preferably a silicon, silicon-on-oxide (SOI) or gallium arsenide (GaAs) substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Barrier layer 15 may be formed over IMD layer 12 to a thickness of preferably from about 100 to 800 Å. For AlCu technology, barrier layer 15 is preferably comprised of Ti/TiN and for copper (Cu) technology, barrier layer 15 is preferably comprised of Ta/TaN. Barrier layer 15 also serves to improve adhesion.

A composite metal layer 25 is formed over barrier layer 15. Composite metal layer 25 preferably comprises a middle second metal layer 16 sandwiched between an upper and lower first metal layers 14, 22.

Upper/lower first metal layers 14, 22 are preferably comprised of aluminum (Al), an aluminum copper alloy (AlCu), copper (Cu) or a copper alloy and are more preferably Al as will be used for illustrative purposes hereafter. Lower Al layer 14 is relatively thin as a portion of it will comprise the fuse 52 and is preferably from about 2000 to 10,000 Å thick and is more preferably about 5000 Å thick. Upper Al layer 22 is a thick layer for low resistance and is preferably thicker than about 3000 Å thick and more preferably thicker than about 8000 Å.

Middle second metal layer 16 is preferably comprised of titanium nitride (TiN), Ti, tantalum nitride (TaN) or Ta and is more preferably TiN as will be used for illustrative purposes hereafter. Middle TiN layer 16 is preferably from about 200 to 2000 Å thick and is more preferably about 1000 Å thick. Middle TiN layer 16 is used as an etch stop layer and can function as an anti-reflective coating (ARC) layer to help in absorbing laser energy.

Optional thin third metal layers 18, 20 may be respectively interposed between lower Al layer 14/middle TiN layer 16 and middle TiN layer 16/upper Al layer 22 as will be shown for illustrative purposes hereafter. Thin third metal layers 18, 20 may be used to improve the electomigration (EM) in the re-distributed layer (RDL). Third metal layers 18, 20 are preferably comprised of titanium (Ti), TiN, Ta or TaN and are more preferably Ti as will be used for illustrative purposes hereafter. Thin third metal layers are preferably from about 30 to 300 Å thick and more preferably about 100 Å thick.

The structure of FIG. 1 includes a fuse region 28 shown, for example, sandwiched between adjacent re-distributed layer (RDL)/bump/bonding pad regions 26.

The upper Al layer 22 is patterned (see FIG. 2) using, for example, first patterned photoresist (PR) layer 24 as shown in FIG. 1 which masks a portion of the upper Al layer 22 within the RDL/bump/bonding pad regions 26.

Patterning of Upper Al Layer 22 to Define RDL/Bump/Bond Pads 30

Figure 2:
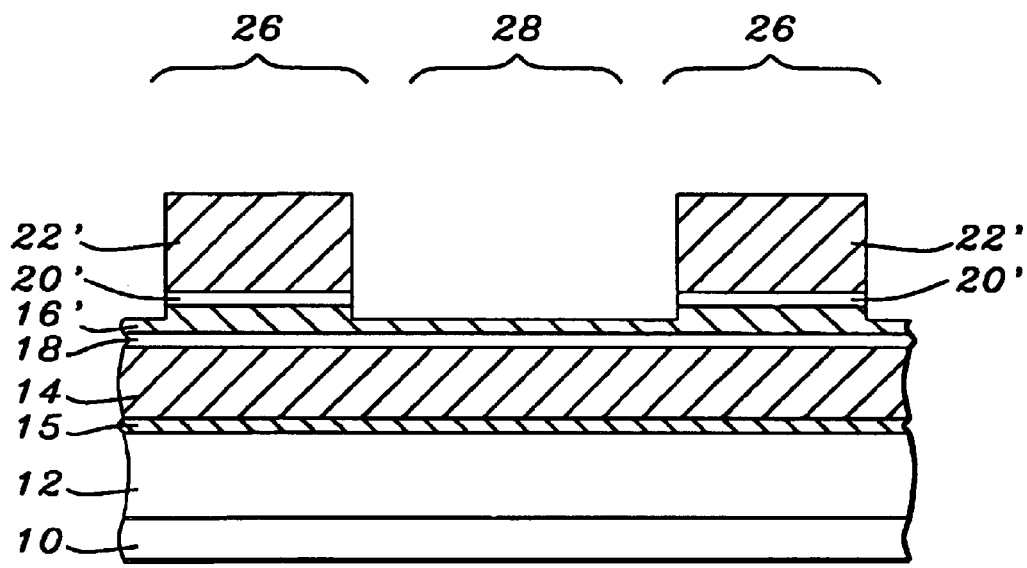

As shown in FIG. 2, upper Al layer 22 is patterned to define RDL/bump/bonding pads 30 using, for example, first patterned PR layer 24, to form patterned upper Al layer portions 22' within RDL/bump/bonding pad regions 26. Upper Al layer 22 is preferably patterned using a reactive ion etch (RIE), an RIE end-point detection etch process or a wet chemical etch process and more preferably an RIE end-point detection process that removes the exposed portions of Ti layer 20 not under first patterned PR layer 24/upper Al layer portions 22' and also removes preferably from about 200 to 500 Å of middle TiN layer 16 by overetching as shown in FIG. 2.

First patterned PR layer 24 is removed after the RIE and the structure may be cleaned as necessary.

Definition of Fuse 52

Figure 3:
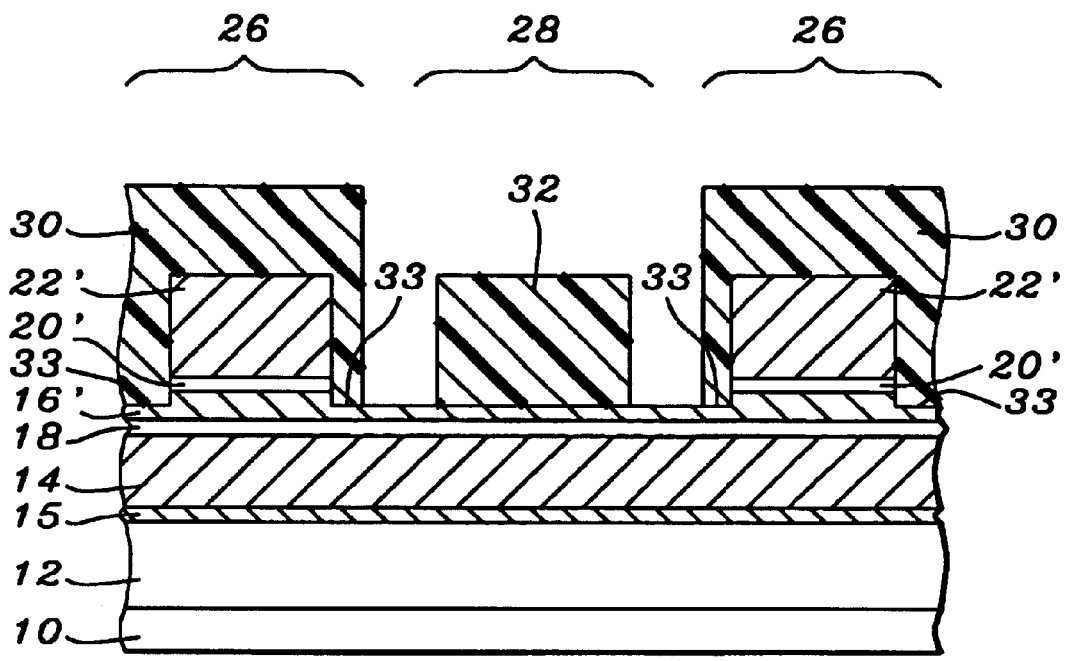

As shown in FIG. 3, second patterned PR layer portions 30; 32 are formed over: patterned upper Al layer portions 22' within RDL/bump/bonding pad regions 26; and over overetched middle TiN layer 16' within fuse region 28 to define the subsequently formed fuse 52, respectively.

As shown in FIG. 3, second patterned PR portions 30 preferably also mask portions 33 of the overetched middle TiN layer 16' within the RDL/bump/bonding pad regions 26 adjacent patterned upper Al layer portions 22'. This will permit the bond/bump pads or RDL 30 to be formed having a step profile (see FIG. 4) which assists in subsequent passivation film step coverage to prevents cracks in the passivation film especially when using thick upper Al layer portions 22'.

Patterning of Overetched Middle TiN Layer 16' and Lower Al Layer 14 to Form Bump/Bond Pads or RDL 30 and Fuse 52

Figure 4:
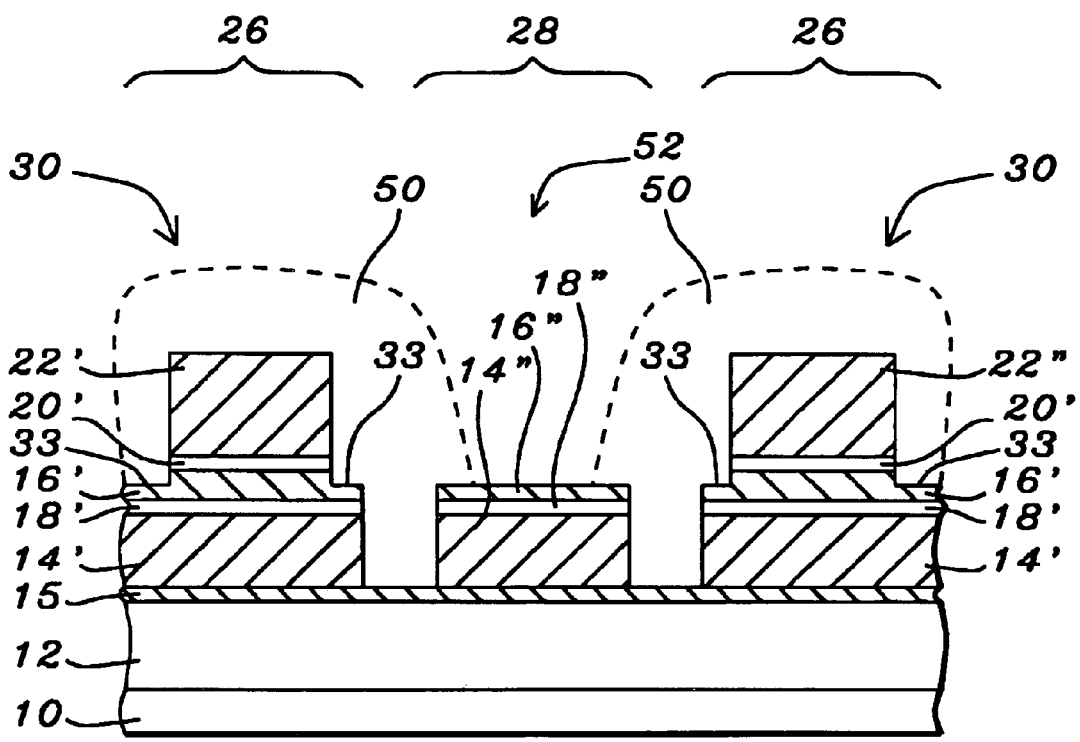

As shown in FIG. 4, using PR portions 30, 32 for example, overetched middle TiN layer 16' and lower Al layer 14 are patterned to form bump/bond pads or RDL 30 and fuse 52. If used, thin Ti layer 18 is also patterned. The layers are preferably patterned using a reactive ion etch (RIE), an RIE end-point detection etch process or a wet chemical etch process and more preferably an RIE process stopping on IMD layer 12 (or barrier layer 15) by end-point detection.

Fuses 52 so formed include TiN ARC layer portions 16".

The portions 33 of the overetched middle TiN layer 16' within the RDL/bump/bonding pad regions 26 adjacent patterned upper Al layer portions 22' can be used for laser fuse guard-rings.

Subsequent processing may then proceed such as, for example, forming a passivation layer 50 (shown in dashed line in FIG. 4) (that may be comprised of SiN for example) over the bump/bond pads or RDL 30 and exposing at least a portion of fuse 52.

The more preferred novel top-metal fuse structure and more preferred method of forming the novel top-metal fuse structure uses a layer of titanium nitride (TiN) (about 1000 Å thick) sandwiched between thick aluminum (Al) metal layers (each ≧5000 Å thick) for an etch-stop. This structure/method allows the fuse so formed to be at the same metal level as the RDL and the bump/bond pads and thereby simplifies the fabrication process steps. The fuse metal thickness is well-controlled because of good etch selectivity between aluminum and titanium nitride. The TiN layer on top of the Al fuse can act as an anti-reflective coating (ARC) helping to absorb laser energy, thus making it easier for laser repair.

Advantages of the Present Invention

The advantages of one or more embodiments of the present invention include:

1. simple robust top metal fuse process for copper interconnects;
2. allows the top metal fuse to be used with very thick top metal (AlCu) for RDL;
3. allows AlCu with TiN ARC fuse to be used with copper interconnects;
4. allows the formation of AlCu/TiN fuse, thick RDL bump/bond pads at the same time;
5. thick metals surrounding a fuse can be used for laser fuse; and
6. stair-shaped profile of the thick metal helps passivation film step coverage and prevents cracking, especially when the metal is very thick.

While particular embodiments of the present invention have been illustrated and described, it is not intended to limit the invention, except as defined by the following claims.

I claim:

1. A top-metal fuse structure and an RDL/bump/bonding pad structure, comprising:

a structure having an overlying intermetal dielectric layer; the structure including a fuse region and an RDL/bump/bonding pad region;

a top-metal fuse structure over the intermetal dielectric layer within the fuse region; the top-metal fuse structure having:
  a patterned lower first metal layer fuse portion over the intermetal dielectric layer; and
  a patterned second metal layer fuse portion centered over the lower first metal layer fuse portion; the patterned lower first metal layer fuse portion and the patterned second metal layer fuse portion each having equal widths; and an RDL/bump/bonding pad structure over the intermetal dielectric layer within the RDL/bump/bonding region; the RDL/bump/bonding pad structure having:
  a patterned lower first metal layer non-fuse portion over the intermetal dielectric layer, the patterned lower first metal layer non-fuse portion having a first width;
  a patterned second metal layer non-fuse portion centered over the lower first metal layer non-fuse portion, the patterned second metal layer non-fuse portion having a second lower width equal to the first width of the patterned lower first metal layer non-fuse portion and a second upper width less than the first width of the patterned lower first metal layer non-fuse portion; and
  a patterned upper first metal layer non-fuse portion centered over the patterned second metal layer non-fuse portion, the patterned upper first metal layer non-fuse portion having a third width less than the second lower width of the patterned second metal layer non-fuse portion whereby a step profile is formed at least as between the patterned upper first metal layer non-fuse portion and the patterned second metal layer lower width non-fuse portion.

2. The structure of claim 1, wherein the structure is a structure is a substrate selected from the group consisting of a silicon substrate, a silicon-on-oxide substrate and a GaAs substrate.

3. The structure of claim 1, wherein the intermetal dielectric layer is comprised of a material selected from the group consisting of: USG, PSG, BPSG, FSG and SiN; the second metal layer is comprised of a material selected from the group consisting of: TiN; Ti, TaN and Ta; and the upper and lower first metal layers are comprised of a material selected from the group consisting of: Al; an aluminum copper alloy; copper and a copper alloy.

4. The structure of claim 1, wherein the intermetal dielectric layer is comprised of USG; the second metal layer is comprised of TiN; and the upper and lower first metal layers are comprised of Al.

5. The structure of claim 1, wherein the intermetal dielectric layer has a thickness of from about 3000 to 15,000 Å; the second metal layer has a thickness of from about 200 to 2000 Å; the upper first metal layer have a thickness of greater than about 3000 Å; and the lower first metal layer has a thickness of from about 2000 to 10,000 Å.

6. The structure of claim 1, wherein the second metal layer has a thickness of about 1000 Å; the upper first metal layer have a thickness of greater than about 8000 Å; and the lower first metal layer has a thickness of about 5000 Å.

7. The structure of claim 1, wherein the top-metal fuse structure further includes a third metal layer fuse portion interposed between the patterned lower first metal layer fuse portion and the patterned second metal layer fuse portion.

8. The structure of claim 1, wherein the top-metal fuse structure further includes a third metal layer fuse portion interposed between the patterned lower first metal layer fuse portion and the patterned second metal layer fuse portion; the third metal layer fuse portion being comprised of a material selected from the group consisting of Ti, TiN, Ta and TaN.

9. The structure of claim 1, wherein the top-metal fuse structure further includes a third metal layer fuse portion interposed between the patterned lower first metal layer fuse portion and the patterned second metal layer fuse portion; the third metal layer fuse portion being comprised of Ti.

10. The structure of claim 1, wherein the top-metal fuse structure further includes a third metal layer fuse portion interposed between the patterned lower first metal layer fuse portion and the patterned second metal layer fuse portion; the third metal layer fuse portion has a thickness of from about 30 to 300 Å.

11. The structure of claim 1, wherein the top-metal fuse structure further includes a third metal layer fuse portion interposed between the patterned lower first metal layer fuse portion and the patterned second metal layer fuse portion; the third metal layer fuse portion has a thickness of about 100 Å.

12. The structure of claim 1, wherein the RDL/bump/bonding pad structure is an RDL.

13. The structure of claim 1, wherein the RDL/bump/bonding pad structure is a bump.

14. The structure of claim 1, wherein the RDL/bump/bonding pad structure is a bonding pad.

15. The structure of claim 1, wherein the structure is a silicon substrate.

16. The structure of claim 1, wherein the structure further includes a barrier layer overlying the intermetal dielectric layer.

17. The structure of claim 1, wherein the structure further includes a barrier layer overlying the intermetal dielectric layer; the barrier layer having a thickness of from about 100 to 800 Å.

18. The structure of claim 1, wherein the structure further includes a barrier layer overlying the intermetal dielectric layer; the barrier layer being comprised of Ti/TiN or Ta/TaN.

19. A top-metal fuse structure and an RDL/bump/bonding pad structure, comprising:
    a substrate having an overlying intermetal dielectric layer; the substrate including a fuse region and an RDL/bump/bonding pad region; the substrate being comprised of a substrate selected from the group consisting of: a silicon substrate, a silicon-on-oxide substrate and a GaAs substrate;
    a top-metal fuse structure over the intermetal dielectric layer within the fuse region; the top-metal fuse structure having:
        a patterned lower first metal layer fuse portion over the intermetal dielectric layer; and
        a patterned second metal layer fuse portion centered over the lower first metal layer fuse portion; the patterned lower first metal
        layer fuse portion and the patterned second metal layer fuse portion each having equal widths; and
    an RDL/bump/bonding pad structure over the intermetal dielectric layer within the RDL/bump/bonding region; the RDL/bump/bonding pad structure having:
        a patterned lower first metal layer non-fuse portion over the intermetal dielectric layer, the patterned lower first metal layer non-fuse portion having a first width;
        a patterned second metal layer non-fuse portion centered over the lower first metal layer non-fuse portion, the patterned second metal layer non-fuse portion having:
            a second lower width equal to the first width of the patterned lower first metal layer non-fuse portion; and
            a second upper width less than the first width of the patterned lower first metal layer non-fuse portion; and
        a patterned upper first metal layer non-fuse portion centered over the patterned second metal layer non-fuse portion, the patterned upper first metal layer non-fuse portion having a third width less than the second lower width of the patterned second metal layer non-fuse portion whereby a step profile is formed at least as between the patterned upper first metal layer non-fuse portion and the patterned second metal layer
        lower width non-fuse portion.

20. The structure of claim 19, wherein the intermetal dielectric layer is comprised of a material selected from the group consisting of: USG, PSG, BPSG, FSG and SiN; the second metal layer is comprised of a material selected from the group consisting of: TiN; Ti, TaN and Ta; and the upper and lower first metal layers are comprised of a material selected from the group consisting of: Al; an aluminum copper alloy; copper and a copper alloy.

21. The structure of claim 19, wherein the intermetal dielectric layer is comprised of USG; the second metal layer is comprised of TiN; and the upper and lower first metal layers are comprised of Al.

22. The structure of claim 19, wherein the intermetal dielectric layer has a thickness of from about 3000 to 15,000 Å; the second metal layer has a thickness of from about 200 to 2000 Å; the upper first metal layer have a thickness of greater than about 3000 Å; and the lower first metal layer has a thickness of from about 2000 to 10,000 Å.

23. The structure of claim 19, wherein the second metal layer has a thickness of about 1000 Å; the upper first metal layer have a thickness of greater than about 8000 Å; and the lower first metal layer has a thickness of about 5000 Å.

24. The structure of claim 19, wherein the top-metal fuse structure further includes a third metal layer fuse portion interposed between the patterned lower first metal layer fuse portion and the patterned second metal layer fuse portion.

25. The structure of claim 19, wherein the top-metal fuse structure further includes a third metal layer fuse portion interposed between the patterned lower first metal layer fuse portion and the patterned second metal layer fuse portion; the third metal layer fuse portion being comprised of a material selected from the group consisting of Ti, TiN, Ta and TaN.

26. The structure of claim 19, wherein the top-metal fuse structure further includes a third metal layer fuse portion interposed between the patterned lower first metal layer fuse portion and the patterned second metal layer fuse portion; the third metal layer fuse portion being comprised of Ti.

27. The method structure of claim 19, wherein the top-metal fuse structure further includes a third metal layer fuse portion interposed between the patterned lower first metal layer fuse portion and the patterned second metal layer fuse portion; the third metal layer fuse portion has a thickness of from about 30 to 300 Å.

28. The structure of claim 19, wherein the top-metal fuse structure further includes a third metal layer fuse portion interposed between the patterned lower first metal layer fuse portion and the patterned second metal layer fuse portion; the third metal layer fuse portion has a thickness of about 100 Å.

29. The structure of claim 19, wherein the RDL/bump/bonding pad structure is an RDL.

30. The structure of claim 19, wherein the RDL/bump/bonding pad structure is a bump.

31. The structure of claim 19, wherein the RDL/bump/bonding pad structure is a bonding pad.

32. The structure of claim 19, wherein the substrate is a silicon substrate.

33. The structure of claim 19, wherein the structure further includes a barrier layer overlying the intermetal dielectric layer.

34. The structure of claim 19, wherein the structure further includes a barrier layer overlying the intermetal dielectric layer; the barrier layer having a thickness of from about 100 to 800 Å.

35. The structure of claim 19, wherein the structure further includes a barrier layer overlying the intermetal dielectric layer; the barrier layer being comprised of Ti/TiN or Ta/TaN.

* * * * *